(12) United States Patent
Peng

(10) Patent No.: US 12,016,149 B2
(45) Date of Patent: Jun. 18, 2024

(54) SERVER

(71) Applicant: CMOTION TECHNOLOGIES LIMITED, HongKong (CN)

(72) Inventor: Hao Peng, Beijing (CN)

(73) Assignee: CMOTION TECHNOLOGIES LIMITED, Hongkong (CN)

( * ) Notice: Subject to any disclaimer, the term of this patent is extended or adjusted under 35 U.S.C. 154(b) by 73 days.

(21) Appl. No.: 17/397,965

(22) Filed: Aug. 9, 2021

(65) Prior Publication Data
US 2022/0046819 A1 Feb. 10, 2022

(30) Foreign Application Priority Data

Aug. 10, 2020 (CN) .......................... 202010796556.1
Aug. 10, 2020 (CN) .......................... 202021651292.2

(51) Int. Cl.
*G06F 1/18* (2006.01)
*G06F 1/20* (2006.01)
(Continued)

(52) U.S. Cl.
CPC ........... *H05K 7/1492* (2013.01); *H05K 1/141* (2013.01); *H05K 1/144* (2013.01); *H05K 7/1438* (2013.01);
(Continued)

(58) Field of Classification Search
CPC ...... H05K 7/14; H05K 7/1492; H05K 7/1457; H05K 1/144; H05K 2201/044; H05K 2203/167; H05K 7/1438; H05K 7/1439; H05K 7/1441; H05K 7/1444; H05K 7/1447; H05K 7/1448; H05K 7/1449; H05K 7/1451; H05K 7/1458; H05K 7/1459; H05K 1/141; H05K 2201/04; H05K 2201/041; G06F 1/189; G06F 13/4081; H01R 27/02; H01R 12/7088; H01R 13/187; H01R 13/62; H01R 13/193; H01R 13/10;
(Continued)

(56) References Cited

U.S. PATENT DOCUMENTS 4,510,553 A * 4/1985 Faultersack ........ H01R 12/7005
439/924.1
4,849,944 A * 7/1989 Matsushita ............ H05K 1/117
365/201
(Continued)

*Primary Examiner* — Adrian S Wilson
*Assistant Examiner* — Gage Crum
(74) *Attorney, Agent, or Firm* — Andrew C. Cheng

(57) ABSTRACT

The disclosure provides a server including a housing, a plurality of hash boards, a power module and an electrical connection board. Each hash board is slidably arranged in a first accommodating space. The plurality of hash boards and the power module are respectively connected to the electrical connection board. The power module supplies power to the plurality of hash boards through the electrical connection board. The electrical connection board includes two conductive connection boards, each of which is provided with a plurality of conductive pins. The pins form multiple pairs of conductive pins in one-to-one correspondence. Each pair of conductive pins corresponds to each hash board and is electrically connected to supply power to the hash board. Each pair of conductive pins is detachably matched with each hash board to connect or disconnect the power supply path of the hash board.

13 Claims, 4 Drawing Sheets

(51) Int. Cl.
  *G06F 1/26* (2006.01)
  *H05K 1/14* (2006.01)
  *H05K 7/14* (2006.01)
(52) U.S. Cl.
  CPC ......... *H05K 7/1439* (2013.01); *H05K 7/1444* (2013.01); *H05K 7/1448* (2013.01); *H05K 7/1449* (2013.01); *H05K 7/1451* (2013.01); *H05K 7/1452* (2013.01); *H05K 7/1457* (2013.01); *H05K 7/1458* (2013.01); *H05K 7/1459* (2013.01); *H05K 2201/041* (2013.01); *H05K 2201/044* (2013.01)
(58) Field of Classification Search
  CPC ... H01R 13/111; H01R 13/6277; H01R 11/14; F16B 21/065
  USPC ..................................................... 361/679.46
  See application file for complete search history.

(56) References Cited

U.S. PATENT DOCUMENTS

| | | | | |
|---|---|---|---|---|
| 5,088,931 A * | 2/1992 | Niciolo | ............. | H01R 13/7034 |
| | | | | 439/924.1 |
| 5,591,035 A * | 1/1997 | Burkholder | .......... | H01R 12/724 |
| | | | | 439/924.1 |
| 6,056,573 A * | 5/2000 | Nishioka | ............. | H01R 12/714 |
| | | | | 439/924.1 |
| 6,757,177 B2 * | 6/2004 | Harris | ...................... | G02B 6/43 |
| | | | | 361/803 |
| 7,076,592 B1 * | 7/2006 | Ykema | ................. | H05K 7/1457 |
| | | | | 710/305 |
| 8,913,382 B2 * | 12/2014 | Wang | ................. | H05K 7/20736 |
| | | | | 361/679.53 |
| 9,431,783 B1 * | 8/2016 | Costello | ............. | H01R 12/7088 |
| 2002/0106926 A1 * | 8/2002 | Lindberg | ................ | G06F 1/189 |
| | | | | 439/342 |
| 2003/0111909 A1 * | 6/2003 | Liu | ........................ | H02J 1/001 |
| | | | | 307/64 |
| 2008/0239687 A1 * | 10/2008 | Leigh | ..................... | H05K 1/144 |
| | | | | 361/788 |
| 2009/0298324 A1 * | 12/2009 | Liu | ........................ | H01R 12/58 |
| | | | | 439/493 |
| 2014/0085809 A1 * | 3/2014 | Ning | ......................... | G06F 1/16 |
| | | | | 361/679.48 |
| 2014/0120760 A1 * | 5/2014 | Zieman | ................. | H01R 12/91 |
| | | | | 29/874 |
| 2015/0364861 A1 * | 12/2015 | Lucke | ................. | A61M 60/122 |
| | | | | 439/271 |
| 2017/0164500 A1 * | 6/2017 | Van Gaal | ................. | H04Q 1/15 |
| 2017/0181311 A1 * | 6/2017 | Fang | ..................... | H05K 7/1487 |
| 2020/0260608 A1 * | 8/2020 | Thibaut | ................. | H05K 7/1489 |
| 2021/0026729 A1 * | 1/2021 | Ferreira | ............. | G06F 11/3447 |
| 2021/0281000 A1 * | 9/2021 | Huang | ................... | H01R 13/50 |

\* cited by examiner

SERVER

FIELD OF THE INVENTION

The disclosure relates to the field of servers, and particularly to a server.

BACKGROUND

In the related technology, the server is provided with a plurality of hash boards, power modules and conductive metals. The conductive metals are used between the power modules and the hash boards to realize the current conduction. One end of the conductive metal is installed on the power module, and the other end is installed on the hash board by screws. When disassembling the hash boards, the hash board installed by screws is not easy to disassemble, the disassembly is difficult, and the disassembly efficiency is low. In addition, multiple hash boards need multiple screws to be fixed separately, which adds operating steps

SUMMARY

The disclosure aims at solving at least one of the technical problems existing in the prior art. Therefore, an object of the disclosure is to provide a server, which is convenient for disassembly and assembly and has high efficiency of disassembly and maintenance.

The server according to the embodiment of the disclosure comprises:
   a housing configured as a frame structure;
   a plurality of hash boards arranged side by side in a first accommodation space in the housing along a left-right direction, each of which is arranged vertically to the left-tight direction and each of which is slidably arranged in the first accommodation space;
   a power module arranged in a second accommodation space in the housing; and
   an electric connection board arranged in the housing, wherein the hash board and the power module respectively connected with the electrical connection board, and the power module supplies power to the hash board through the electrical connection board; the electrical connection board comprises two conductive connection boards which connect positive and negative electrodes respectively, each of which is provided with multiple conductive pins; the conductive pins on the two conductive connection boards correspond to each other to form a plurality pair of conductive pins; each pair of conductive pins corresponds to each hash hoard and is electrically, connected to supply power to the hash board, and each pair of conductive pins is detachably matched with each hash board to connect or disconnect a power supply path of the hash board.

According to the server of the embodiment of the disclosure, by setting of the conductive pin, the electrical connection board can be plug into or unplug from the hash board through the conductive pin, omitting the steps of disassembling and installing the screws; simplifying the operation steps, and facilitating installation or disassembly, and improving the efficiency of disassembly and maintenance. In addition, multiple pairs of conductive pins of the electrical connection board can be respectively connected to the plurality of hash boards to supply power to the plurality of hash hoards at the same time. There is no need to provide multiple electrical connection boards, which improves the integration of the server, reduces the cost and further simplifies the operation steps.

In some embodiments, one end of the hash board facing the electrical connection board is provide with a mounting base, a first fitting part is arranged in the mounting base, and the conductive pin are detachably matched to the first fitting part.

In some embodiments, one of a hook or a groove is provided in the mounting base, and the other of a hook or a groove is provided on the conductive pins; electrical connection between the hash board and the conductive pin is realized by the cooperation of the hook and the groove.

In some embodiments, the mounting base is provided with a mounting hole and an inner wall of the mounting hole is provided with a reed protruding towards axis of the mounting hole; the conductive pin is shaped into a cylinder and is inserted into the mounting hole to be obstructively connected with the reed.

In some embodiments, both ends of the reed are fixed to the inner wall of the mounting hole and the middle part of the reed protrudes toward the axis of the mounting hole.

In some embodiments, one end of the reed is fixed to the inner wall of the mounting hole and the other end is cocked.

In some embodiments, the electrical connection board further comprising:
   a PCB substrate, on which two contact areas are respectively connected with the positive and negative electrodes of the power supply;
   a first conductive strip being suitable for connecting with the power module; and
   a second conductive strip electrically connected with the hash board, wherein the two conductive connection board are respectively connected with the second conductive strip of the two contact areas to connect the positive and negative electrodes of the power supply.

In some embodiments, the electrical connection board further comprises:
   an insulating layer arranged between the two conductive connection boards to avoid short circuit between the conductive connection boards connecting the positive and negative electrodes of the power supply.

In some embodiments, the two conductive connection board are parallel in the length direction of the PCB substrate and are separated by a preset gap in the height direction of the PCB substrate; the plurality of conductive pins are arranged evenly at intervals in the length direction of each conductive connection board;
   the insulating layer is arranged at the positive electrode of the conductive connection board.

In some embodiments, the server also comprises:
   a control module, a power supply module and a heat dissipation module; the housing is further configured with a third accommodating space and a fourth accommodating space; the control module is slidably arranged in the third accommodation space of the housing, and the third accommodation space is located between the first accommodation space and the second accommodation space;
   the power supply module is slidably arranged in the fourth accommodation space of the housing; the fourth accommodation space is located between the first accommodation space and the second accommodation space, and spaced apart from the third accommodating space in the left-right direction;
   the control module and the power supply module are respectively connected with the electrical connection board, and the power supply module supplies power to the control module through the electric connection board;

the heat dissipation module at least dissipates heat from the plurality of hash boards.

Other aspects and advantages of the disclosure will be partially given in the following description, and will be easy to understand through the following description or be learned from the practice of the disclosure.

BRIEF DESCRIPTION OF THE DRAWINGS

The above and/or additional aspects and advantages of the disclosure will become obvious and easy to understand from the description of the embodiment in combination with the following drawings.

NUMERALS IN THE FIGURES

Figure 1:
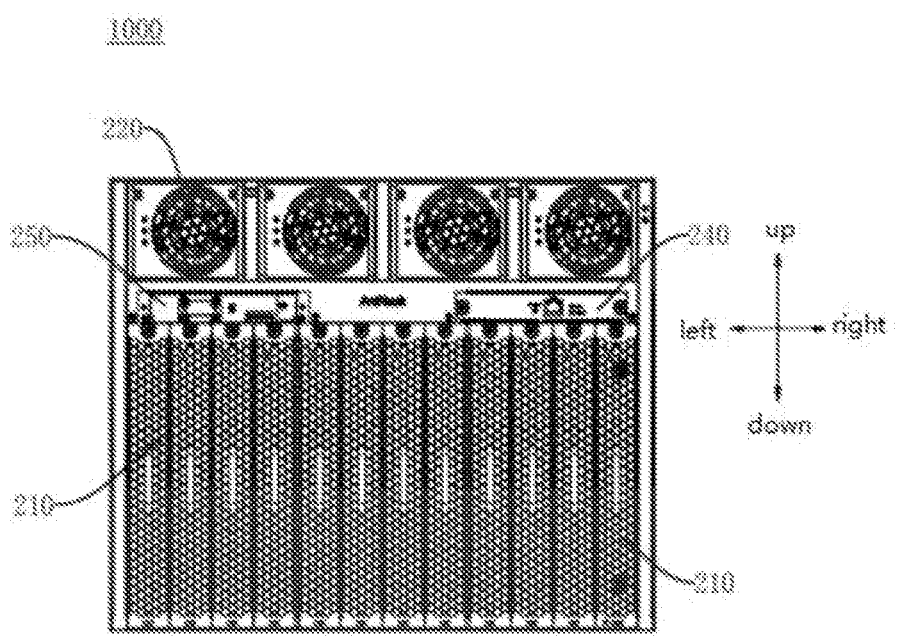
FIG. 1 is an angle of schematic view of a server according to one embodiment of the disclosure.

Server 1000;
Electrical connection board 100; PCB substrate 10; Contact area 11;
Second conductive strip 60; Conductive connecting board 70; Conductive pin 71; Insulation layer 80; Hash board 210; Mounting base 211; Mounting hole 213; Reed 214; Round hole 215;
Power module 220; Housing 230; Control module 240; Power supply module 250.

DETAILED DESCRIPTION

The embodiments of the disclosure are described in detail below with reference to the attached exemplary drawings.

In the description of the disclosure, it should be understood that the orientation or position relationship indicated by the terms "central", "length"; "up", "down", "front", "back", "left", "right", "inside" and "outside" is based on the orientation or position relationship shown in the figure, only for the convenience of describing the disclosure and simplifying the description, not to indicate or imply that the device or element must have a specific orientation, be constructed and operated in a specific orientation, and it cannot be understood as a limitation to the disclosure.

In the description of the disclosure, "plurality" means two or more.

As shown in FIGS. 1-7, a server 1000 of the disclosure comprises a housing 230, a plurality of hash boards 210, a power module 220 and an electrical connection board 100.

Figure 2:
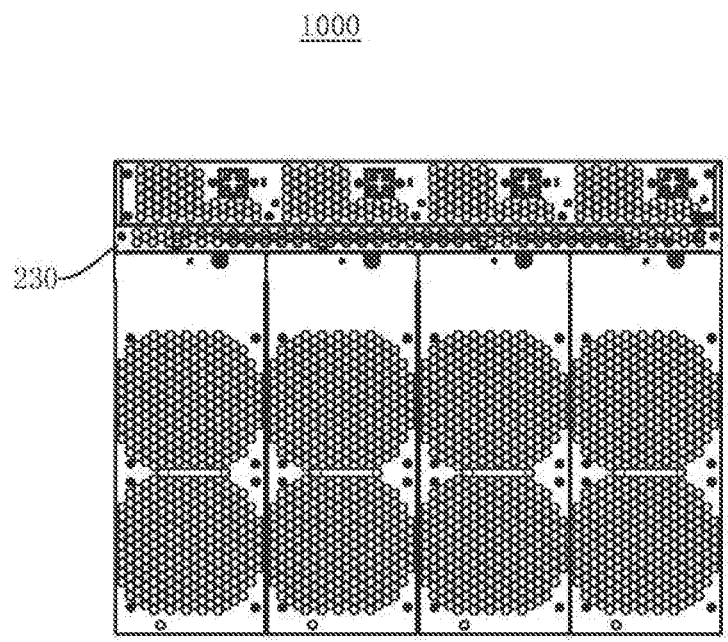
FIG. 2 is another angle of schematic view of a server according to one embodiment of the disclosure.

As shown in FIGS. 1 and 2, the housing 230 is in the shape of a frame structure. The plurality of hash boards 210 are arranged side by side in a first accommodating space in the housing 230 along the left-right direction. Each hash board 210 is arranged vertically to the left-right direction, and each hash board 210 is slidably arranged in the first accommodation space to facilitate the disassembly and assembly of the hash board 210 in the front and rear directions. The power module 220 is arranged in a second accommodating space in the housing 230. The electrical connection board 100 is arranged in the housing 230. The hash board 210 and the power module 220 are respectively connected to the electrical connection board 100, and the power module 220 supplies power to the hash board 210 through the electrical connection board 100. Disposing the plurality of hash boards 210 and power modules 220 in the first accommodating space and the second accommodating space respectively can facilitate the separate disassembly and assembly of the hash boards and the power modules, and facilitate the modular configuration of the server 1000.

Figure 3:
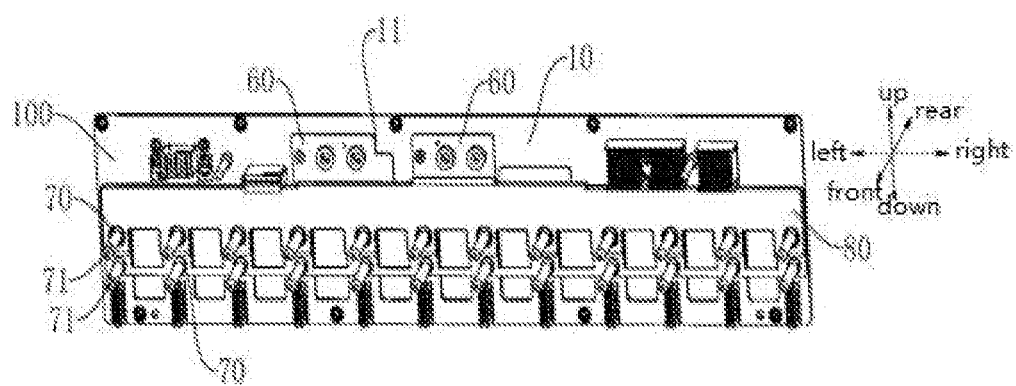
FIG. 3 is a schematic view of an electrical connection board according to one embodiment of the disclosure.
Figure 6:
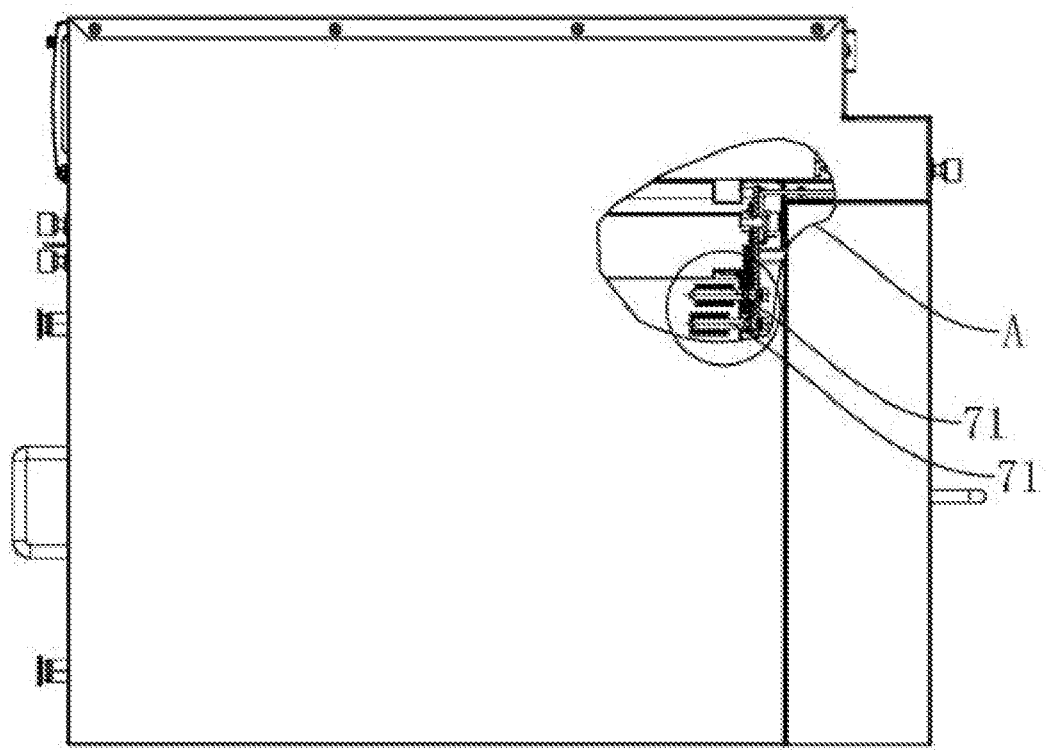
FIG. 6 is a sectional view of a partial structure of a hash board according to one embodiment of the disclosure.
Figure 7:
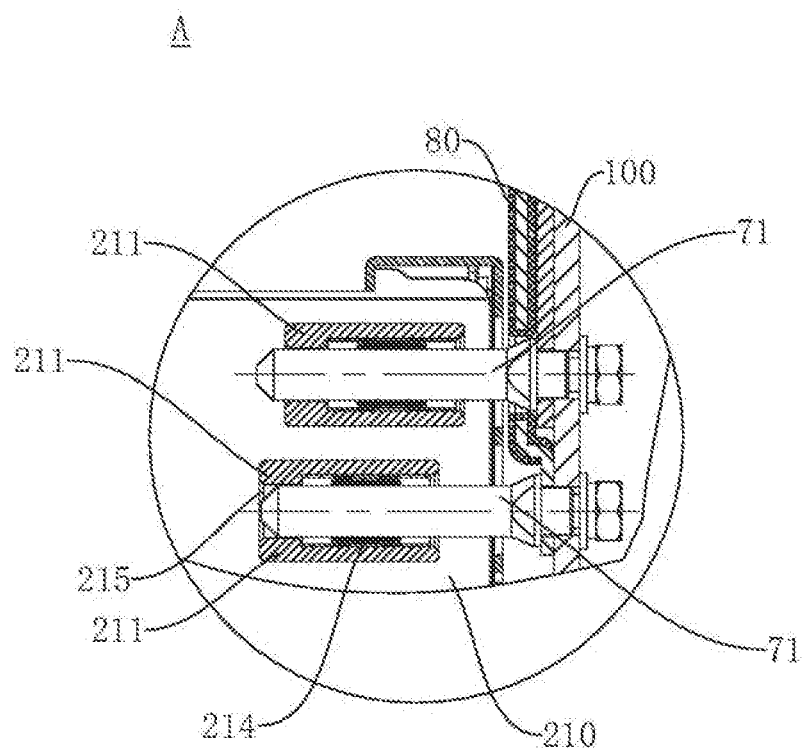
FIG. 7 is an enlarged view of part A in FIG. 6.

In combination with FIG. 3, FIG. 6 and FIG. 7, the electrical connection board 100 comprises two conductive connection boards 70, which are spaced and arranged side by side in the up-down direction as shown in FIG. 3. The two conductive connection boards 70 are respectively connected with the positive and negative electrodes of the power supply. Each conductive connection board 70 is provided with a plurality of conductive pins 71, and the conductive pins 71 on the two conductive connection boards 70 are one-to-one corresponding to form a plurality of pairs of conductive pins 71. For example, the two conductive pins 71 arranged in the up and down directions of FIG. 3 may be a pair of conductive pins TI. Each pair of conductive pins 71 corresponds to each hash board 210 one by one and is electrically connected to supply power to the hash board 210. Each pair of conductive pins 71 and each hash board 210 are detachably matched to connect or disconnect the power supply path of the hash board 210.

The server 1000 according to the embodiment of the disclosure, by setting of the conductive pin 71, the electrical connection board 100 can be plug into or unplug from the hash board 210 through the conductive pin 71, omitting the steps of disassembling and installing the screws, simplifying the operation steps, and facilitating installation or disassembly, and improving the efficiency of disassembly and maintenance. In addition, multiple pairs of conductive pins 71 of the electrical connection board 100 can be respectively connected to the plurality of hash boards 210 to supply power to the plurality of hash boards 210 at the same time. There is no need to provide multiple electrical connection boards 100, which improves the integration of the server 1000, reduces the cost and further simplifies the operation steps.

Figure 4:
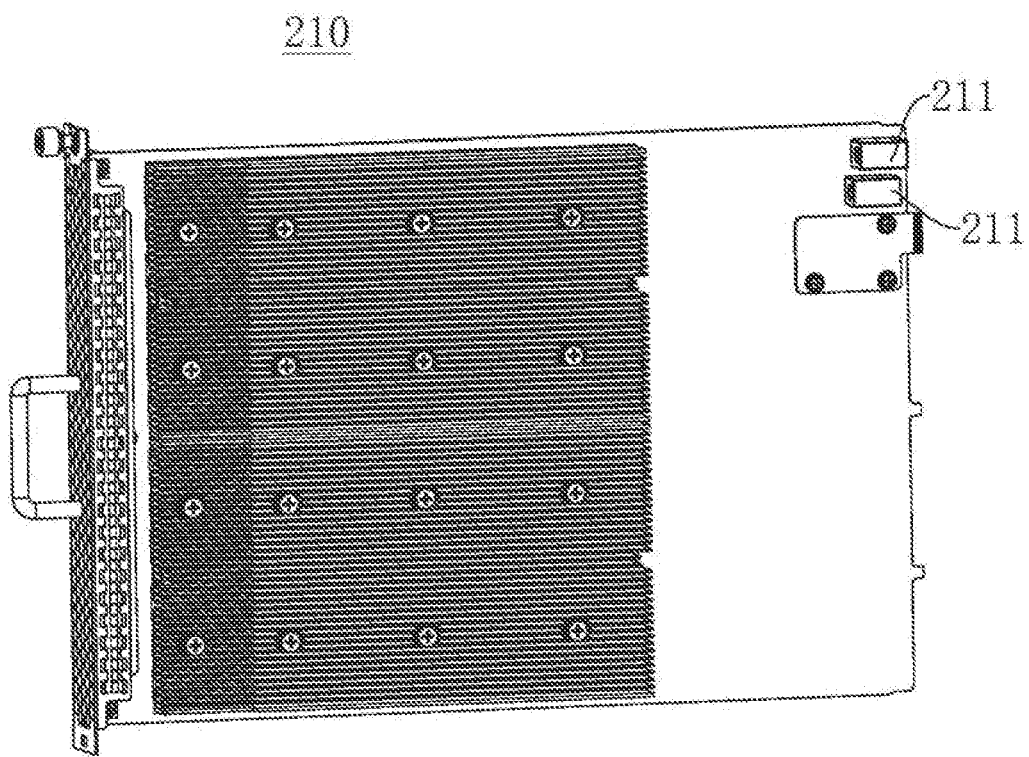
FIG. 4 is a schematic view of a hash board according to one embodiment of the disclosure.

In some embodiments, as shown in FIG. 4, FIG. 6 and FIG. 7, one end of the hash board 210 toward the electrical connection board 100 has a mounting base 211. Each hash board 210 is provided with two mounting bases 211 arranged up and down, and each pair of conductive pins 71 can insert into the two mounting bases 211. The mounting base 211 can be a conductive part to realize the current conduction when the conductive pins 71 insert into the mounting base 211. The mounting base 211 may be arranged on one side of the board body of the hash board 210 (for example, one side of the left-right direction in FIG. 1), that is, two mounting bases 211 of the same hash board 210 can be simultaneously arranged on the left side of the board body of the hash board 210, or two mounting bases 211 can be simultaneously arranged on the right side of the board body of the hash board 210. The mounting base 211 can be a protruding structure protruding from the board body of the hash board 210 to facilitate the insertion of the conductive pins 71 and ensure the structural reliability of the hash board 210. The first fitting part can be arranged in the mounting bases 211, and the conductive pins 71 can be detachably matched with the first fitting part. Through the setting of the first fitting part, the installation can be convenient, and the installation reliability of the conductive pins 71 and the mounting bases 211 can be improved.

In some embodiments, the mounting base 211 is provided with a hook or a groove, and the conductive pin 71 is provided with a groove matching with the hook or a hook matching with the groove. The electrical connection between the hash board 210 and the conductive pin 71 is realized by the cooperation of the hook and the groove. Through the setting of the hook and the groove, the stability of the installation of the mounting bases 211 and the conductive pins 71 can be ensured.

In other embodiments, as shown in FIG. 4-FIG. 7, the mounting base 211 is provided with a mounting hole 213 and the inner wall of the mounting hole 213 is provided with a reed 214 protruding towards the axis of the mounting hole 213. The conductive pin 71 is shaped into a cylinder and is inserted into the mounting hole 213 to be obstructively connected with the reed 214. It should be noted that the reed 214 is made of a conductive material. When the conductive pin 71 inserts into the mounting hole 213, the conductive pin 71 can squeeze the reed 214 toward the inner side wall of the mounting hole 213, so as to ensure that there is a certain interaction force between the conductive pin 71 and the mounting base 211, so as to ensure that there is an effective contact between the conductive pin 71 and the mounting base 211, so as to realize the current conduction between the conductive pin 71 and the mounting base 211. The reliability of the electrical connection between the electrical connection board 100 and the hash board 210 can be increased.

Figure 5:
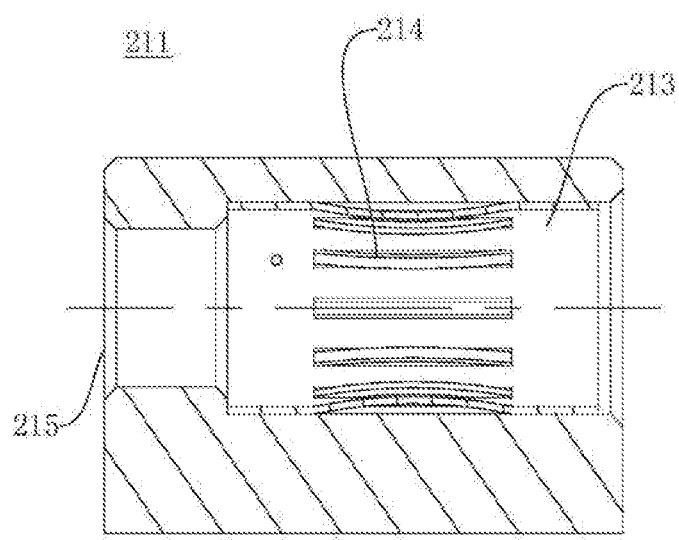
FIG. 5 is a schematic view of a mounting base according to one embodiment of the disclosure.

As shown in FIG. 5-FIG. 7, one end of the mounting base 211 (for example, the front end as shown in FIG. 6) can also be provided with a round hole 215, which is opposite to the mounting hole 213, so that the round hole 215 and the mounting hole 213 can pass through the mounting base 211. The hole diameter of the round hole 215 can be slightly larger than the diameter of the conductive pin 71. The round hole 215 can position the conductive pin 71, so as to avoid the eccentric position of the conductive pin 71 due to processing, assembly errors, or stress, so as to avoid the situation that the deformation of the reed 214 in one direction is too large, and the deformation in the other direction is too small. The even contact between the conductive pin 71 and the reed 214 is ensured.

For example, in combination with FIG. 7, two mounting bases 211 on the same hash board 210 can be staggered in the up-down direction, so that after one conductive pin 71 is inserted into the mounting base 211 at the upper end, the conductive pin 71 can extend out of the mounting base 211, and after the other conductive pin 71 is inserted into the other mounting base 211 at the lower end, the conductive pin 71 cannot extend out of the mounting base 211. The conductive pin 71 can be installed on the electrical connection board 100 through a fastener, or the conductive pin 71 can be integrally formed with the electrical connection board 100.

Further, as shown in FIG. 4 and FIG. 5, both ends of the reed 214 are fixed to the inner wall of the mounting hole 213, and the middle part of the reed 214 protrudes toward the axis of the mounting hole 213. In this way, the conductive pin 71 can be easily inserted into the mounting hole 213, and the conductive pin 71 can press the reed 214 towards the inner wall of the mounting hole 213 to generate interaction force. For example, the side of the reed 214 facing the guide pin 71 may be an arc surface to reduce the friction between the conductive pin and the mounting base 211.

In some embodiments, one end of the reed 214 is fixed to the inner wall of the mounting hole 213, and the other end is cocked. In this way, the conductive pin 71 can be easily inserted into the mounting hole 213, and a certain interaction force between the conductive pin 71 and the mounting base 211 can also be ensured, so as to ensure effective contact between the conductive pin 71 and the mounting base 211.

According to some embodiments of the disclosure, as shown in FIG. 3 and FIG. 7, the electrical connection board 100 further comprises a PCB substrate 10, a first conductive strip and a second conductive strip 60. The PCB substrate 10 is configured with two contact areas 11 respectively connecting the positive and negative electrodes of the power supply. The first conductive strip is suitable for connecting with the power module 220. The second conducting strip 60 and the hash board 210 are electrically connected. The two conductive connection boards 70 are respectively connected with the second conductive strip 60 of the two contact areas 11 to connect the positive and negative electrodes of the power supply respectively. Both sides of the PCB substrate 10 (for example, front and rear directions shown in FIG. 3) can be each provided with two contact areas 11, and the contact area 11 can be provided with through holes (not shown in the figure) through both sides of PCB substrate 10. Conductive layer is provided in the through hole and both sides. Thus, the conductive layer, the first conductive strip and the second conductive strip 60 can be connected to form a conductor, thereby realize the conduction of current.

For example, the conductive connection board 70 at the upper end as shown in FIG. 3 can be connected with the negative electrode of the power supply, and the conductive connection board 70 at the lower end as shown in FIG. 3 can be connected with the positive electrode of the power supply, so as to realize the current transmission. For example, the conductive connection board 70 at the upper end as shown in FIG. 3 is connected with the contact area 11 at the left end as shown in FIG. 3, and the contact area 11 can be connected with the negative electrode of the power supply, so that the conductive connection board 70 is connected with the negative electrode of the power supply. The conductive connection board 70 at the lower end as shown in FIG. 3 is connected with the contact area 11 at the right end as shown in FIG. 3, and the contact area 11 can be connected with the positive electrode of the power supply, so that the conductive connection board 70 can be connected with the positive electrode of the power supply, so as to realize the transmission of current.

In some embodiments, as shown in FIG. 3 and FIG. 7, the electrical connection board 100 may also include an insulating layer 80 arranged between the two conductive connection boards 70 to avoid short circuit between the conductive connection boards 70 connecting the positive and negative sides of the power supply. The insulating layer 80 is arranged at the positive electrode of the conductive connection board 70. The insulating layer 80 can be an insulating material coated or boarded on the conductive connecting board 70 of the positive electrode. The insulating layer 80 has good stability and can effectively avoid short circuit between the two conductive connecting boards 70.

In some embodiments, two conductive connecting boards 70 are parallel in the length direction of the PCB substrate 10 (for example, the left-right direction of FIG. 3) and a predetermined gap is separated between the height direction of PCB substrate 10 (for example, the up-down direction of FIG. 3). In the length direction of each conductive connecting board 70, the plurality of conductive pins 71 are arranged evenly at intervals to facilitate the connection with multiple hash boards 210.

According to one embodiment of the disclosure, the server 1000 further comprises a control module 240, a power supply module 250 and a heat dissipation module. The housing 230 is also provided with a third accommodation space and a fourth accommodation space, the control module 240 is slidably arranged in the third accommodation space of the housing 230, and the third accommodation space is located between the first accommodation space and the second accommodation space. The power supply module 250 is slidably arranged in the fourth accommodation space of the housing 230. The fourth accommodation space is located between the first accommodation space and the second accommodation space, and is separated from the third accommodation space in the left-right direction. In this way, the detachable connection of the hash board 210, the control module 240 and the power supply module 250 with the housing 230 can be realized, and the modular design of the server 1000 is realized with clean and safe structure.

The control module 240 and the power supply module 250 can be respectively connected with the electrical connection board 100, and the power supply module 250 supplies power to the control module 240 through the electrical connection board 100. In this way, by setting the electrical connection board 100, the control module 240 and the power calculation board 210 can be powered separately, which can ensure the power supply safety of the control module 240, and facilitate the detection and maintenance in case of failure, so as to quickly check the two circuits and improve the efficiency of troubleshooting. The heat dissipation module dissipates heat from at least a plurality of hash boards 210. The heat dissipation module can include various heat dissipation structures such as fans or heat pipes to ensure the heat dissipation effect of the server 1000.

In the description of this specification, the reference to the description of the terms "one embodiment", "some embodiments", "schematic embodiments", "examples", "specific examples", or "some examples" means that the specific features, structures, materials or features described in combination with the embodiment or examples are included in at least one embodiment or example of the disclosure. In this specification, the schematic expressions of the above terms do not necessarily refer to the same embodiments or examples.

Although the embodiments of the disclosure have been shown and described those of ordinary skill in the art can understand that a variety of changes, modifications, substitutions, and variants can be made to these embodiments without departing from the principle and purpose of the disclosure, and the scope of the disclosure is defined by the claims and their equivalents.

The invention claimed is:

1. A server, comprising:
   a housing configured as a frame structure;
   a plurality of hash boards arranged side by side in a first accommodation space in the housing along a left-right direction, each of which is arranged vertically to the left-right direction and each of which is slidably arranged in the first accommodation space;
   a power module arranged in a second accommodation space in the housing;
   an electrical connection board arranged in the housing, wherein the hash board and the power module respectively connected with the electrical connection board, and the power module supplies power to the hash board through the electrical connection board; and
   two conductive connection boards stacked in a front-rear direction on the electrical connection board, wherein a first conductive connection board of the two conductive connection boards contacts the electrical connection board and a second conductive connection board of the two conductive connection boards comprises a stepped portion that contacts the electrical connection board, such that the first conducive connection board and the stepped portion are spaced and arranged side by side in an upper-down direction and connect positive and negative electrodes respectively, each of the first conductive connection board and the stepped portion is provided with multiple conductive pins; the conductive pins on the two conductive connection boards correspond to each other to form a plurality pair of conductive pins; each pair of conductive pins arranged in the upper-down direction corresponds to each hash board and is electrically connected to supply power to the hash board, and each pair of conductive pins is detachably matched with each hash board to connect or disconnect a power supply path of the hash board.

2. The server according to claim 1, wherein one end of the hash board facing the electrical connection board is provide with a mounting base, a first fitting part is arranged in the mounting base, and the conductive pins are detachably matched to the first fitting part, the mounting base being located within a boundary of the hash board in a lengthwise direction of the hash board which is perpendicular to the upper-down direction and the left-right direction.

3. The server according to claim 2, wherein the mounting base is provided with a mounting hole and an inner wall of the mounting hole is provided with a reed protruding towards axis of the mounting hole; the conductive pin is shaped into a cylinder and is inserted into the mounting hole to be obstructively connected with the reed.

4. The server according to claim 3, wherein both ends of the reed are fixed to the inner wall of the mounting hole and the middle part of the reed protrudes toward the axis of the mounting hole.

5. The server according to claim 3, wherein one end of the reed is fixed to the inner wall of the mounting hole and the other end is cocked.

6. The server according to claim 1, wherein the electrical connection board further comprises:
   a PCB substrate, on which two contact areas are respectively connected with the positive and negative electrodes of the power supply;
   a first conductive strip being suitable for connecting with the power module; and
   a second conductive strip electrically connected with the hash board, wherein the two conductive connection board are respectively connected with the second conductive strip of the two contact areas to connect the positive and negative electrodes of the power supply.

7. The server according to claim 6, wherein the electrical connection board further comprises:
   an insulating layer arranged between the two conductive connection boards to avoid short circuit between the two conductive connection boards connecting the positive and negative electrodes of the power supply.

8. The server according to claim 7, wherein the two conductive connection board are parallel in the length direction of the PCB substrate and are separated by a preset gap in the height direction of the PCB substrate; the plurality of conductive pins are arranged evenly at intervals in the length direction of each conductive connection board; and
   the insulating layer is arranged at the positive electrode of the two conductive connection boards.

9. The server according to claim 1, wherein the server further comprises a control module, a power supply module and a heat dissipation module; the housing is further configured with a third accommodating space and a fourth accommodating space; the control module is slidably arranged in the third accommodation space of the housing, and the third accommodation space is located between the first accommodation space and the second accommodation space;

the power supply module is slidably arranged in the fourth accommodation space of the housing; the fourth accommodation space is located between the first accommodation space and the second accommodation space, and spaced apart from the third accommodating space in the left-right direction;

the control module and the power supply module are respectively connected with the electrical connection board, and the power supply module supplies power to the control module through the electric connection board; and the heat dissipation module at least dissipates heat from the plurality of bash boards.

10. The server according to claim 2, wherein the hash board comprises a body with a main surface perpendicular to the left-right direction, the mounting base being secured to the main surface.

11. The server according to claim 1, wherein each of the hash boards is provided with a first mounting base and a second mounting base which are arranged in a way that the first mounting base is closer to an edge of the hash board facing the electrical connection board such that when the hash board is inserted into the first accommodation space of the housing, the first mounting base is in contact with the conductive pin of the first conductive connection board prior to interconnection of the second mounting base and the conductive pin of the stepped portion.

12. The server according to claim 11, wherein the first conductive connection board is for electrically connecting with the negative electrode of the power supply and the second conductive connection board is for electrically connecting with the positive electrode of the power supply.

13. The server according to claim 11, wherein the first mounting base and the second mounting base each comprises a conductive part for electrically connecting with a corresponding one of the conductive pins.

* * * * *